United States Patent
Clark

(10) Patent No.: US 9,312,830 B1
(45) Date of Patent: Apr. 12, 2016

(54) VOLUME CURVE ADJUSTMENT FOR SIGNAL PROCESSING HEADROOM

(71) Applicant: Jeffrey Clark, Alhambra, CA (US)

(72) Inventor: Jeffrey Clark, Alhambra, CA (US)

(73) Assignee: Audyssey Laboratories, Inc., Los Angeles, CA (US)

(*) Notice: Subject to any disclaimer, the term of this patent is extended or adjusted under 35 U.S.C. 154(b) by 246 days.

(21) Appl. No.: 14/094,323

(22) Filed: Dec. 2, 2013

(51) Int. Cl.
*H03G 7/00* (2006.01)

(52) U.S. Cl.
CPC .................................... *H03G 7/00* (2013.01)

(58) Field of Classification Search
CPC ......... H03G 7/00; H03G 7/001; H03G 7/007; H03G 3/04; H03G 1/02; H03G 3/001; H03G 3/02
See application file for complete search history.

(56) References Cited

U.S. PATENT DOCUMENTS

| | | | |
|---|---|---|---|
| 4,166,924 | A | 9/1979 | Berkley et al. |
| 5,396,618 | A | 3/1995 | Fukui et al. |
| 6,744,882 | B1 | 6/2004 | Gupta et al. |
| 7,058,188 | B1 | 6/2006 | Allred |
| 7,058,369 | B1 | 6/2006 | Wright et al. |
| 2008/0056504 | A1 | 3/2008 | Gorges et al. |
| 2008/0219476 | A1 | 9/2008 | Okabayashi |
| 2008/0319564 | A1 | 12/2008 | Furge et al. |
| 2009/0326692 | A1* | 12/2009 | Lin et al. ............... 700/94 |
| 2011/0293103 | A1 | 12/2011 | Park et al. |
| 2012/0039489 | A1* | 2/2012 | Chen et al. ............. 381/107 |

FOREIGN PATENT DOCUMENTS

JP 2004-140650 * 5/2004

OTHER PUBLICATIONS

Machine translation of Jp 2004-140650, 6 pages.*

* cited by examiner

*Primary Examiner* — Ping Lee
(74) *Attorney, Agent, or Firm* — Kenneth L. Green; Averill & Green

(57) ABSTRACT

An attenuation control before digital signal processing provides digital headroom. A pre-digital signal processing volume control receives a volume control signal and provides a pre-digital signal processing first attenuation of an input signal before digital signal processing. A master volume control provides a master volume control attenuation after the digital signal processing. The first attenuation may be the same as the master volume control attenuation, or it may be less or more than the master volume control attenuation, depending on the application and desired headroom. The first attenuation and master volume control attenuation may be linearly related or non-linearly related, or not a mathematical function (non-continuous, etc) at all. Changes in the attenuation may be ramped to avoid discontinuities in the signal, preferably over a period between 10 and 100 milliseconds, and are preferably applied as close to simultaneously with master volume changes as possible.

17 Claims, 4 Drawing Sheets

| Volume setting | dB attenuation |
|---|---|
| 10 | 0 |
| 9 | -3 |
| 8 | -6 |
| 7 | -10 |
| 6 | -15 |
| 5 | -21 |
| 4 | -28 |
| 3 | -36 |
| 2 | -45 |
| 1 | -55 |
| 0 | -∞ |

FIG. 4
(prior art)

| Volume setting | dB attenuation in the pre-digital signal processing volume control | dB attenuation in the master volume control | Total attenuation |
|---|---|---|---|
| 10 | 0 | 0 | 0 |
| 9 | -3 | -3 | -6 |
| 8 | -6 | -6 | -12 |
| 7 | -10 | -10 | -20 |
| 6 | -15 | -15 | -30 |
| 5 | -21 | -21 | -42 |
| 4 | -28 | -28 | -56 |
| 3 | -36 | -36 | -72 |
| 2 | -45 | -45 | -90 |
| 1 | -55 | -55 | -110 |
| 0 | -∞ | -∞ | -∞ |

FIG. 5

| Volume setting | dB attenuation from volume setting | dB attenuation from volume-tracking headroom attenuation | Total attenuation |
|---|---|---|---|
| 10 | 0 | 0 | 0 |
| 9 | -3 | -2 | -5 |
| 8 | -6 | -4 | -10 |
| 7 | -10 | -6 | -16 |
| 6 | -15 | -8 | -23 |
| 5 | -21 | -10 | -31 |
| 4 | -28 | -12 | -40 |
| 3 | -36 | -14 | -50 |
| 2 | -45 | -16 | -61 |
| 1 | -55 | -18 | -73 |
| 0 | -∞ | -∞ | -∞ |

VOLUME CURVE ADJUSTMENT FOR SIGNAL PROCESSING HEADROOM

BACKGROUND OF THE INVENTION

The present invention relates to digital signal processing and in particular to embedded firmware or software in a smartphone to compensate for lost gain where headroom is required for digital signal processing.

Digital signal processing technologies are often applied in a smartphone before a master volume control and such digital signal processing technologies may require creating digital headroom which reduces overall gain, and as a result, system volume is reduced. Making up for the reduced gain often requires pushing the signal to clipping, or through a hard limiter with look-ahead, or compressor with residual clipping on transients. The use of limiters and compressors to reduce the dynamic range of the signal often further introduces artifacts (distortion and level oscillations—"pumping" artifacts) into the audio signal.

BRIEF SUMMARY OF THE INVENTION

The present invention addresses the above and other needs by providing an attenuation control before digital signal processing to provide digital headroom. A pre-digital signal processing volume control receives a volume control signal and provides a first attenuation of an input signal before digital signal processing. A master volume control provides a second attenuation after the digital signal processing. The first attenuation may be the same as the second attenuation, or it may be less or more than the second attenuation, depending on the application and desired headroom. The first and second attenuations may be linearly related or non-linearly related, or not a mathematical function (non-continuous, etc) at all. Changes in the attenuation may be ramped to avoid discontinuities in the signal, preferably over a period between 10 and 100 milliseconds, and are preferably applied as close to simultaneously with master volume changes as possible.

In accordance with one aspect of the invention, there is provided digital signal processing receiving a current master volume control setting or changes in the master volume control setting from the embedded firmware framework or operating system, and adjusts a first attenuation prior to digital signal processing to changes in a master volume control in a timely fashion.

In accordance with one aspect of the invention, there is provided a master volume control used, after digital signal processing, to provide a second attenuation in a system having a first attenuation prior to the digital signal processing, the first attenuation to provide adequate digital headroom.

In accordance with still another aspect of the invention, a master volume control is used, after digital signal processing which introduces gain in a system, to control overall volume.

In accordance with another aspect of the invention, there is provided a method to reduce the amount of clipping, or reduce the artifacts due to compressors or limiters in known systems. The method is particularly advantageous when the signal processing technologies require additional headroom as the volume is lowered, in cases such as psychoacoustic equal loudness compensation ("loudness"), where some aspect of the signal is progressively increased in level as the volume settings is reduced.

In accordance with still another aspect of the invention, an algorithm receives notification of master volume changes from the embedded firmware framework or operating system, or continuously polls (queries) the embedded firmware framework or operating system for the current master volume setting and reacts to changes in a timely fashion.

In accordance with yet another aspect of the invention, an algorithm observes a number of steps, such as 1 to 11, or 1 to 100 in a volume control. Sometimes the steps are listed as attenuation, in decibels, where 0 dB (unity gain) is the maximum, or a maximum above 0 dB might be used in some cases. The algorithm determines a decibel curve corresponding to the steps in the system's master volume units.

In accordance with another aspect of the invention, an algorithm provides a more desirable curve based on the headroom required by the signal processing, balanced with continuity of the volume curve. The more desirable curve must stay below the original volume curve.

In accordance with another aspect of the invention, a volume control algorithm is implement before signal processing. The volume control algorithm implements attenuation according to the difference between a volume setting curve and an attenuation curve.

In accordance with yet another aspect of the invention, there is provided a volume control method including volume ramping to minimize discontinuities. Volume ramping transitions smoothly from the current volume level to a new volume level over a period of time (for example, 10's of milliseconds to 100's of milliseconds) in order to avoid pops and clicks that arise from a discontinuity.

In accordance with another aspect of the invention, there is provided a method for applying a pre-digital processing volume control. The method includes creating a master volume control signal corresponding to a master volume attenuation, providing the master volume control signal to a pre-digital signal processing volume control, receiving an input signal by the pre-digital signal processing volume control, determining a first attenuation in the pre-digital signal processing volume control based on the master volume control signal, applying the first attenuation to the input signal in the pre-digital signal processing volume control to create a first attenuated signal, digitally processing the first attenuated signal to produce a processed signal, and applying the master volume attenuation to the processed signal in the master volume control to create an output signal.

BRIEF DESCRIPTION OF THE SEVERAL VIEWS OF THE DRAWING

The above and other aspects, features and advantages of the present invention will be more apparent from the following more particular description thereof, presented in conjunction with the following drawings wherein:

FIG. 4 is an example of a prior art master volume control curve.

FIG. 5 shows a first split volume control providing 1 dB of headroom for every 1 dB of master volume attenuation according to the present invention.

FIG. 6 shows a second split volume control avoiding an impractically low headroom curve, according to the present invention.

DETAILED DESCRIPTION OF THE INVENTION

The following description is of the best mode presently contemplated for carrying out the invention. This description is not to be taken in a limiting sense, but is made merely for the purpose of describing one or more preferred embodiments of the invention. The scope of the invention should be determined with reference to the claims.

Figure 1:
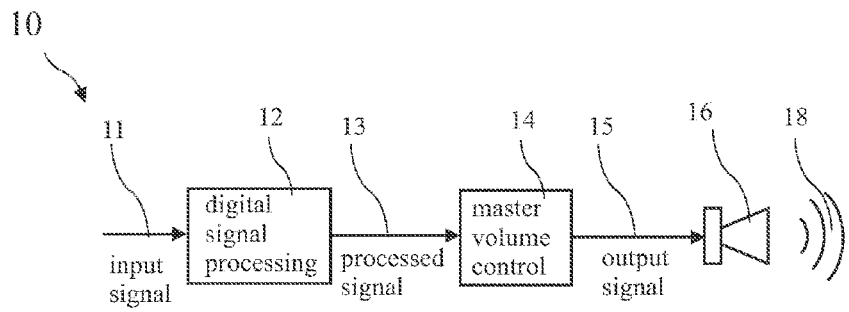
FIG. 1 shows a prior art processing flow.

A prior art processing flow 10. The processing flow 10 includes an input signal 11, digital signal processing 12, a processed signal 13, a master volume control 14, and an output signal 15 provided to a transducer 16 to produce audio signals 18 shown in FIG. 1. The master volume control 14 is typically part of a pre-amplifier portion of an integrated amplifier or receiver, or in a separate pre-amplifier and may be may be implemented in software (digitally), in a dedicated DSP chip, as part of a DAC, or as part of an amplifier, or in any other digital or analog component of the signal chain. The output signal 15 is provided to an amplifier section of an integrated amplifier or receiver, or to a separate power amplifier. In some known systems the input signal 11 is reduced in the digital signal processing 12 to maintain digital headroom, and the volume of the system 10 is reduced. The digital signal processing 12 may include limiting and compression to reduce the dynamic range of the input signal 11, thus introducing artifacts (distortion and level oscillations—"pumping" artifacts).

Figure 2:
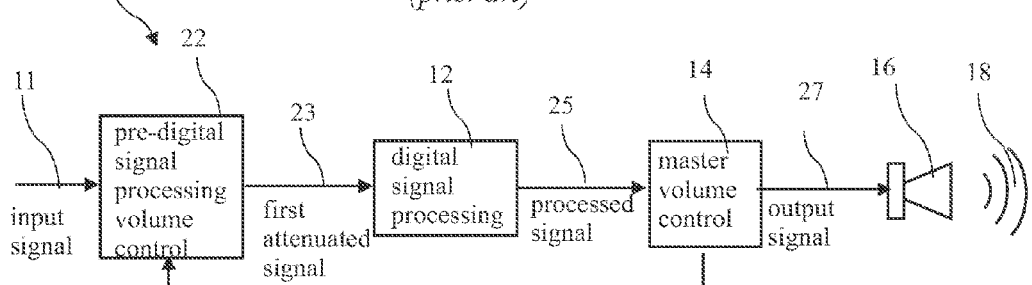
FIG. 2 shows a processing flow with split volume control according to the present invention.

A processing flow for a system 20 with split volume control according to the present invention is shown in FIG. 2. The input signal 11 is first processed by a pre-digital signal processing volume control 22 to provide a first attenuated signal 23. The first attenuated signal 23 is processed by the digital signal processing 12 to produce a processed signal 25. The processed signal 25 is provided to the master volume control 14 to produce an output signal 27. The master volume control 14 provides a control signal 28 to the pre-digital signal processing volume control 22. The control signal 28 determines the level of attenuation of the pre-digital signal processing volume control 22.

Figure 3:
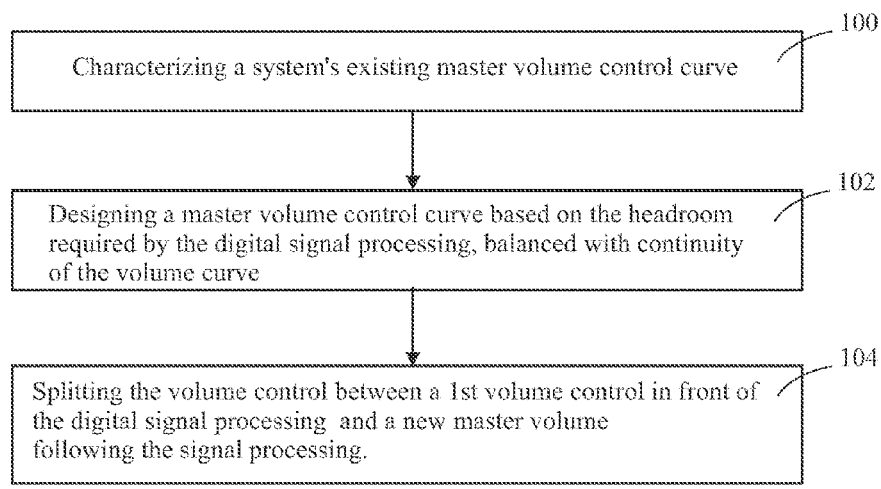
FIG. 3 is a method for split volume control according to the present invention.

A method for split volume control according to the present invention is shown in FIG. 3. The method includes characterizing a system's existing master volume control curve at step 100, designing a master volume control curve based on the headroom required by the digital signal processing, balanced with continuity of the volume curve at step 102, and splitting the volume control between a 1st volume control in front of the digital signal processing and the original master volume control following the signal processing at step 104.

A user usually sees some number of steps, such as 1 to 11, or 1 to 100 in a volume control display or markings on a volume control knob. An example of a volume control interface is shown in FIG. 4 where "10" corresponds to a maximum volume (0 dB attenuation) and "0" corresponds to zero signal strength (∞ dB attenuation). Sometimes the steps are listed as attenuation, in decibels, where 0 dB (unity gain) is the maximum volume. A maximum above 0 dB might be used in other cases.

An example of a first adjusted volume control setting the pre-digital signal processing volume control 22 attenuation to the same attenuation as the master volume control 14 is shown in FIG. 5. The pre-digital signal processing volume control 22 results in ½ dB of headroom for every 1 dB of total attenuation.

A second adjusted volume control avoiding an impractically low headroom curve is shown in FIG. 6 where the pre-digital signal processing volume control 22 provides less attenuation than the master volume control 14 to avoid such low headroom.

In addition to the headroom curves described above, the pre-digital signal processing volume control may be a first attenuation which is a linear mathematical function of the master volume control attenuation, or a non-linear mathematical function of the master volume control attenuation, or may be related to the master volume control attenuation but also include limits or steps. Any pre-digital signal processing volume control first attenuation determined at least in part on the master volume control attenuation is intended to come within the scope of the present invention.

In most instances, the master volume control 14 cannot be adjusted. In a system where the master volume control 14 can be adjusted, the original attenuation may be allocated between the pre-digital signal processing volume control 22 and the master volume control 14 to provide additional headroom. In one embodiment, the pre-digital signal processing volume control 22 would be to used to attenuate the signal up to the headroom required before the DSP, then apply the remaining attenuation in the master volume control 14.

In yet another example an automatic gain control algorithm is used in systems where the master volume control may be adjusted according to a signal from the pre-digital signal processing volume control 22. The pre-digital signal processing volume control 22 monitors the input signal 11 level and adjusts the attenuation in the pre-digital signal processing volume control 22 to maintain adequate headroom in the digital signal processor 12. A signal indicating the attenuation applied by the pre-digital signal processing volume control 22 is sent to the master volume control 14 and used to adjust the attenuation in the master volume control 14 to achieve the desired total volume setting. The rate of change of the pre-digital signal processing volume control 22 is controlled (e.g., volume ramping) to minimize discontinuities. The volume ramping is applied in the pre-digital signal processing volume control 22 and transitions smoothly from the current volume level to a new volume level over some time (10's of milliseconds to 100's of milliseconds) in order to avoid pops and clicks that arise from a discontinuity. The signal sent to the master volume control 14 automatically reflects the volume ramping applied in the pre-digital signal processing volume control 22.

At some input signal 11 levels it is preferable to reduce or stop attenuating in the pre-DSP volume control 22. There's no benefit to further attenuate the input signal 11 to achieve greater than the maximum required headroom, and unnecessarily attenuation may sacrifice resolution. For example, a 16-bit signal divided by four (about 12 dB attenuation), becomes effectively a 14-bit signal, causing loss of resolution. As a result, if only 6 dB of headroom is required by the DSP implementation, it is preferable to stop increasing the pre-DSP volume control's attenuation at −6 dB, and let the normal volume curve continue from there, at least in fixed-precision (fixed point) systems. In floating point systems, the present invention is still applicable as the signal must ultimately be converted back to fixed point before it can be passed to a Digital to Analog Converter (DAC). However, the attenuation doesn't need to happen before the DSP. The attenuation may be applied anywhere in the floating point signal processing chain, though it would make sense to perform the attenuation before an Automatic Gain Control (AGC) or limiter.

Figure 7:
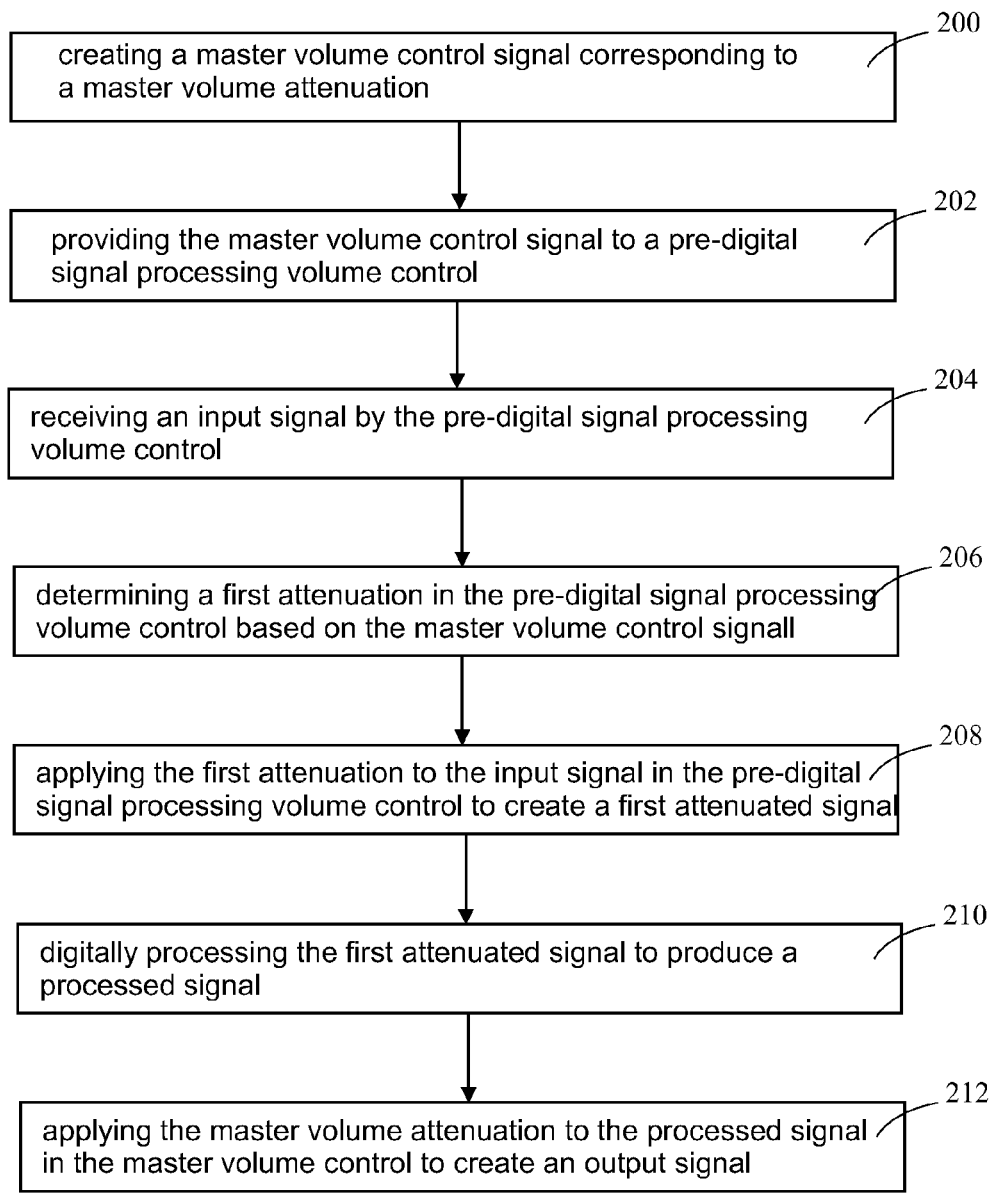
FIG. 7 shows a method for applying a pre-digital processing volume control, according to the present invention.

A method for applying a pre-digital processing volume control is shown in FIG. 7. The method includes creating a master volume control signal corresponding to a master volume attenuation at step 200, providing the master volume control signal to a pre-digital signal processing volume control at step 202, receiving an input signal by the pre-digital signal processing volume control at step 204, determining a first attenuation in the pre-digital signal processing volume control based on the master volume control signal at step 206, applying the first attenuation to the input signal in the pre-digital signal processing volume control to create a first attenuated signal at step 208, digitally processing the first attenuated signal to produce a processed signal at step 210, and applying the master volume attenuation to the processed signal in the master volume control to create an output signal at step 212.

While the invention herein disclosed has been described by means of specific embodiments and applications thereof, numerous modifications and variations could be made thereto by those skilled in the art without departing from the scope of the invention set forth in the claims.

I claim:

1. A volume control method comprising:
   receiving a master volume control signal corresponding to a master volume control attenuation;
   providing the master volume control signal to a pre-digital signal processing volume control;
   receiving an input signal by the pre-digital signal processing volume control;
   determining a pre-digital signal processing first attenuation in the pre-digital signal processing volume control based on the master volume control signal;
   applying the first attenuation to the input signal in the pre-digital signal processing volume control before performing digital signal processing of the input signal to create a first attenuated signal;
   digitally processing the first attenuated signal to produce a processed signal;
   applying the master volume control attenuation to the processed signal in the master volume control to create an output signal; and
   providing the output signal to produce audio signals;
   wherein the first attenuation is applied before the input signal is provided before Automatic Gain Control (AGC) processing.

2. The method of claim 1, wherein the first attenuation is a lower level of attenuation than the master volume control attenuation for all volume settings.

3. The method of claim 1, wherein the first attenuation is the same level of attenuation as the master volume control attenuation for all volume settings.

4. The method of claim 1, wherein the first attenuation is a higher level of attenuation as the master volume control attenuation for all volume settings.

5. The method of claim 1, wherein the first attenuation is a linear mathematical function of the master volume control attenuation.

6. The method of claim 1, wherein the first attenuation is a non-linear mathematical function of the master volume control attenuation.

7. The method of claim 1, wherein the first attenuation is a function of the master volume control attenuation and further includes limits and steps.

8. The method of claim 1, wherein the rate of change of the first attenuation is limited.

9. The method of claim 1, wherein a change in attenuation is applied over a time period between 10's and 100's of milliseconds.

10. The method of claim 1, wherein a change in attenuation is applied over a time period of 10's of milliseconds.

11. The method of claim 1, wherein a change in attenuation is applied over a time period of 100's of milliseconds.

12. The method of claim 1, wherein a change in attenuation is applied over a time period of between 1 and 10 milliseconds.

13. The method of claim 1, wherein the first attenuation is about one half the master volume control attenuation for all volume settings.

14. The method of claim 1, wherein the master volume control attenuation and the first attenuation both increase towards −∞ dB with each decrease in volume setting for all volume settings.

15. The method of claim 1, wherein the first attenuation is half a level of attenuation as the master volume control attenuation for all volume settings.

16. A volume control method comprising:
   receiving a master volume control signal corresponding to a master volume control attenuation;
   providing the master volume control signal to a pre-digital signal processing volume control;
   receiving an input signal by the pre-digital signal processing volume control; setting a pre-digital signal processing first attenuation in the pre-digital signal processing volume control to equal an attenuation requested by the master volume control signal;
   applying the first attenuation to the input signal in the pre-digital signal processing volume control before performing digital signal processing of the input signal to create a first attenuated signal;
   digitally processing the first attenuated signal to produce a processed signal;
   applying the master volume control attenuation to the processed signal in the master volume control to create an output signal; and
   providing the output signal to produce audio signals;
   wherein the first attenuation is applied before the input signal is provided before Automatic Gain Control (AGC) processing.

17. A volume control method comprising:
   receiving a master volume control signal corresponding to a master volume control attenuation;
   providing the master volume control signal to a pre-digital signal processing volume control;
   receiving an input signal by the pre-digital signal processing volume control;
   setting a pre-digital signal processing first attenuation in the pre-digital signal processing volume control to a value less than an attenuation requested by the master volume control signal;
   applying the first attenuation to the input signal in the pre-digital signal processing volume control before performing digital signal processing of the input signal to create a first attenuated signal;
   digitally processing the first attenuated signal to produce a processed signal;
   applying the master volume control attenuation to the processed signal in the master volume control to create an output signal; and
   providing the output signal to produce audio signals;

wherein the first attenuation is applied before the input signal is provided before Automatic Gain Control (AGC) processing.

* * * * *